United States Patent
Herrmann (10) Patent No.: US 10,490,707 B2
(45) Date of Patent: Nov. 26, 2019

(54) METHOD OF PRODUCING OPTOELECTRONIC COMPONENTS AND SURFACE-MOUNTED OPTOELECTRONIC COMPONENT

(71) Applicant: OSRAM Opto Semiconductors GmbH, Regensburg (DE)

(72) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 3 days.

(21) Appl. No.: 15/573,529

(22) PCT Filed: May 6, 2016

(86) PCT No.: PCT/EP2016/060210
§ 371 (c)(1),
(2) Date: Nov. 13, 2017

(87) PCT Pub. No.: WO2016/180732
PCT Pub. Date: Nov. 17, 2016

(65) Prior Publication Data
US 2018/0122997 A1 May 3, 2018

(30) Foreign Application Priority Data
May 13, 2015 (DE) .......................... 10 2015 107 588

(51) Int. Cl.
*H01L 33/50* (2010.01)
*H01L 33/46* (2010.01)
(Continued)

(52) U.S. Cl.
CPC ............ *H01L 33/502* (2013.01); *H01L 33/46* (2013.01); *H01L 33/486* (2013.01); *H01L 33/54* (2013.01);
(Continued)

(58) Field of Classification Search
CPC ......... H01L 2924/00; H01L 2924/0002; H01L 2933/0041; H01L 2224/48091;
(Continued)

(56) References Cited

U.S. PATENT DOCUMENTS 8,802,470 B2   8/2014  Sekiya
8,945,960 B2   2/2015  Sekiya
(Continued)

FOREIGN PATENT DOCUMENTS

DE   10 2010 053 362 A1   6/2012
DE   10 2011 087 886 A1   6/2013
(Continued)

OTHER PUBLICATIONS

Notice of Reasons for Rejection dated Nov. 6, 2018, of counterpart Japanese Application No. 2017-556848 along with an English translation.

*Primary Examiner* — Jonathan Han
(74) *Attorney, Agent, or Firm* — DLA Piper LLP (US)

(57) ABSTRACT

A method of producing optoelectronic components includes A) providing a carrier and optoelectronic semiconductor chips including contact elements arranged on a contact side of the semiconductor chip; B) applying the semiconductor chips laterally next to one another on to the carrier, wherein the contact sides face the carrier during application; C) applying an electrically-conductive layer at least on to subregions of the sides of the semiconductor chip not covered by the carrier; D) applying a protective layer at least on to subregions of side surfaces of the semiconductor chips running transversely to the contact surface; E) electrophoretically depositing a converter layer on to the electrically-conductive layer, wherein the converter layer is configured to convert at least part of radiation emitted by the semiconductor chip into radiation of a different wavelength range; and F) removing the electrically-conductive layer from
(Continued)

regions between the converter layer and the semiconductor chips.

15 Claims, 6 Drawing Sheets

(51) Int. Cl.
*H01L 25/16* (2006.01)
*H01L 33/00* (2010.01)
*H01L 33/48* (2010.01)
*H01L 33/54* (2010.01)

(52) U.S. Cl.
CPC .......... *H01L 25/167* (2013.01); *H01L 33/007* (2013.01); *H01L 2933/0025* (2013.01); *H01L 2933/0033* (2013.01); *H01L 2933/0041* (2013.01)

(58) Field of Classification Search
CPC ................. H01L 33/505; H01L 33/504; H01L 2933/005; H01L 33/62
USPC ......................... 257/98; 438/27, 29; 204/600
See application file for complete search history.

(56) References Cited

U.S. PATENT DOCUMENTS

| | | | | |
|---|---|---|---|---|
| 9,368,468 B2* | 6/2016 | Stuber | ................... | H01L 24/17 |
| 2002/0187571 A1* | 12/2002 | Collins, III | ............ | C25D 13/02 |
| | | | | 438/29 |
| 2009/0057690 A1* | 3/2009 | Chakraborty | ........... | H01L 33/44 |
| | | | | 257/88 |
| 2012/0205695 A1 | 8/2012 | Lin | | |
| 2013/0134445 A1* | 5/2013 | Tarsa | ...................... | B29C 43/18 |
| | | | | 257/88 |
| 2015/0129918 A1* | 5/2015 | Ikegami | ................ | H01L 33/507 |
| | | | | 257/98 |
| 2016/0190110 A1* | 6/2016 | Gootz | ................... | H01L 27/156 |
| | | | | 438/27 |

FOREIGN PATENT DOCUMENTS

| | | |
|---|---|---|
| DE | 10 2012 216 552 A1 | 3/2014 |
| DE | 10 2013 207 226 A1 | 10/2014 |
| DE | 10 2013 207 611 A1 | 10/2014 |
| DE | 10 2013 212 247 A1 | 12/2014 |
| DE | 10 2013 109 031 A1 | 2/2015 |
| DE | 10 2014 108 368 A1 | 12/2015 |
| DE | 10 2015 101 143 A1 | 7/2016 |
| DE | 10 2015 102 460 A1 | 8/2016 |
| DE | 10 2015 102 699 A1 | 8/2016 |
| DE | 10 2015 104 886 A1 | 10/2016 |
| DE | 10 2015 107 586 A1 | 11/2016 |
| DE | 10 2015 107 590 A1 | 11/2016 |
| DE | 10 2015 107 593 A1 | 11/2016 |
| DE | 10 2015 109 852 A1 | 12/2016 |
| JP | 2004-276690 A | 10/2004 |
| JP | 2006-210491 A | 8/2006 |
| JP | 2007-134378 A | 5/2007 |
| JP | 2008-272451 A | 11/2008 |
| JP | 2013-258232 A | 12/2013 |
| JP | 2013-258233 A | 12/2013 |
| JP | 2013-258234 A | 12/2013 |
| JP | 2014-151691 A | 8/2014 |
| JP | 2014-241400 A | 12/2014 |
| WO | 2014/001149 A1 | 1/2014 |
| WO | 2015/024801 A1 | 2/2015 |

* cited by examiner

METHOD OF PRODUCING OPTOELECTRONIC COMPONENTS AND SURFACE-MOUNTED OPTOELECTRONIC COMPONENT

TECHNICAL FIELD

This disclosure relates to a method of producing optoelectronic components and a surface-mounted optoelectronic component.

BACKGROUND

A method of applying a converter layer on to a semiconductor chip is known from WO 2014/001149 A1, for example. There is nonetheless a need to provide a method of producing optoelectronic components by which a converter layer is homogenously applied on to semiconductor chips and by which at the same time side surfaces of the semiconductor chips are mirror-coated. There is also a need to provide an optoelectronic component with mirror-coated side surfaces and a homogenous converter layer.

SUMMARY

I provide a method of producing optoelectronic components including A) providing a carrier and a multitude of optoelectronic semiconductor chips, wherein each semiconductor chip includes contact elements for external electrical contacting arranged on a contact side of the semiconductor chip; B) applying the semiconductor chips laterally next to one another on to the carrier, wherein the contact sides are made to face the carrier during application; C) applying an electrically-conductive layer at least on to subregions of the sides of the semiconductor chip not covered by the carrier, wherein the electrically-conductive layer is of contiguous design; D) applying a protective layer at least on to subregions of side surfaces of the semiconductor chips running transversely to the contact surface; E) electrophoretically depositing a converter layer on to the electrically-conductive layer, wherein the converter layer is configured to convert at least part of radiation emitted by the semiconductor chip into radiation of a different wavelength range during the intended operation; and F) removing the electrically-conductive layer from regions between the converter layer and the semiconductor chips.

I also provide a surface-mounted optoelectronic component including an optoelectronic semiconductor chip with exposed contact elements for external electrical contacting of the component, wherein the contact elements are arranged on a joint contact side of the semiconductor chip, a converter layer formed contiguously, continuously and without interruptions and covers a radiation exit surface opposite the contact side by at least 90%, an encapsulation layer applied on to the converter layer and completely covers and encloses the converter layer, and an electrically-conductive layer on side surfaces of the semiconductor chip extending transversely to the contact side, wherein the converter layer is configured to convert at least part of a radiation emitted by the semiconductor chip into radiation of a different wavelength range during the intended operation of the component, the converter layer has a homogenous layer thickness along its entire extent on the semiconductor chip with maximum thickness deviations of 5% from an average value of the layer thickness, the layer thickness of the converter layer is at most 70 μm, the converter layer is a powder of converter particles, which is held on to the semiconductor chip by the encapsulation layer, and the electrically-conductive layer has a layer thickness of 100 nm to 500 nm, covers all side surfaces of the semiconductor chip in each case by at least 90% and has a reflectivity of at least 80% to the radiation emitted by the semiconductor chip.

I further provide a method of producing optoelectronic components including A) providing a carrier and a multitude of optoelectronic semiconductor chips, wherein each semiconductor chip includes contact elements for external electrical contacting arranged on a contact side of the semiconductor chip; B) applying the semiconductor chips laterally next to one another on to the carrier, wherein the contact sides are made to face the carrier during application; C) applying an electrically-conductive layer at least on to subregions of the sides of the semiconductor chip not covered by the carrier, wherein the electrically-conductive layer is of contiguous design; D) applying a protective layer at least on to subregions of side surfaces of the semiconductor chips running transversely to the contact surface; E) electrophoretically depositing a converter layer on to the electrically-conductive layer, wherein the converter layer is configured to convert at least part of a radiation emitted by the semiconductor chip into radiation of a different wavelength range during the intended operation; and F) removing the electrically-conductive layer from regions between the converter layer and the semiconductor chips, wherein in step F), the protective layer prevents the electrically-conductive layer from being removed in regions covered by the protective layer, in step E), the regions of the electrically-conductive layer covered by the protective layer remain free of the converter layer, and the electrically-conductive layer is reflective for light emitted by the semiconductor chips during operation.

LIST OF REFERENCE NUMERALS 1 semiconductor chip
2 carrier
4 electrically-conductive layer
5 converter layer
6 encapsulation layer
7 protective layer
10 contact element
11 contact element
12 contact side
13 substrate
14 semiconductor layer sequence
15 side surface of the semiconductor chip 1
16 radiation exit side
20 connecting layer
21 protective frame
100 optoelectronic component
200 connecting area
201 connecting area

DETAILED DESCRIPTION

I provide a method of producing optoelectronic components that may comprise a step A), in which a carrier and a multitude of optoelectronic semiconductor chips are provided. The carrier may be a metal carrier or a glass carrier or a semiconductor carrier or a plastic carrier, for example. Each semiconductor chip comprises contact elements for external electric contacting. The contact elements are arranged on a contact side of the semiconductor chip. Preferably, all contact elements required for external contacting of the semiconductor chip are arranged on a single side of the semiconductor chip, i.e., the contact side. In particular, the contact elements are freely accessible in the unmounted state of the semiconductor chip.

The method may comprise a step B) in which the semiconductor chips are attached on to the carrier laterally next to one another. The lateral direction is defined by the main extension direction of the carrier. In this case, the semiconductor chips are preferably attached such that the contact sides in each case face the carrier. In other words, after attachment, the contact sides are preferably covered by the carrier.

The method may comprise a step C) in which an electrically-conductive layer is applied at least on to subregions of the sides of the semiconductor chips not covered by the carrier. Preferably, all sides of the semiconductor chips uncovered by the carrier are covered by the electrically-conducting layer, preferably completely and/or in a form-fit manner. Particularly preferably, the electrically-conductive layer is formed contiguously, continuously and without interruptions on the carrier and on the semiconductor chips. In this case, the electrically-conductive layer on the multitude of semiconductor chips is one single layer. The electrically-conductive layer is directly applied on to the semiconductor chips, i.e., is then in direct contact with the semiconductor chips. In this case, no further layers are previously applied on to the semiconductor chips.

Application of the electrically-conductive layer can be effected by a sputtering process or vapor deposition or atomic layer deposition, ALD for short, or chemical vapor deposition, CVD for short, or physical vapor deposition, PVD, for short.

The thickness of the electrically-conductive layer is at least 20 nm or 100 nm or 300 nm, for example. Alternatively, or in addition, the thickness of the electrically-conductive layer is at most 2 µm or 1 µm or 500 nm. The thickness of the electrically-conductive layer preferably refers to the maximum or average or minimum thickness along the entire extent of the electrically-conducting layer.

In a step D), a protective layer may be applied at least on to subregions of side surfaces of the semiconductor chips extending transversely to the contact surface. Preferably, the protective layer is electrically-insulating and non-conductive. For example, the protective layer comprises or consists of a polymer or an acrylate or an Omocer or an epoxy resin or a photoresist or a plastic material such as a white plastic material. In this case, a silicone or a resin containing titanium dioxide particles is also possible. The layer thickness of the protective layer on the side surfaces prior to or after a potential singulation process of the semiconductor chips is at least 10 µm or 20 µm or 50 µm, for example. Alternatively or in addition, the protective layer on the side surfaces is at most 100 µm or 80 µm or 70 µm.

In a step E), a converter layer may be electrophoretically deposited on to the electrically-conducting layer, in particular deposited directly and/or in a form-fit manner on to the electrically-conducting layer. During the intended operation, the converter layer is configured to convert at least part of a radiation emitted by the semiconductor chips into radiation of a different wavelength range.

During operation, the semiconductor chips emit visible light of 400 nm to 800 nm or light in the ultraviolet range 200 nm to 400 nm. The converter layer converts the radiation emitted by the semiconductor chip, e.g., into visible light such as red/and/or yellow and/or green and/or blue light. It is in particular possible for the converter layer to cause a total conversion of the radiation emitted from the semiconductor chips.

For electrophoretic deposition of the converter layer, the carrier with the semiconductor chips is immersed in an electrophoretic bath, which is added with organic solvents and converter particles, for example. By applying an electric voltage to the electrophoretic bath, the converter particles to be deposited move to the in particular exposed, electrically-conductive layer and settle on it. In this way, the converter layer is formed, which is preferably in direct contact with the electrically-conducting layer.

In particular, the converter layer deposited by the electrophoretic process is formed contiguously, continuously and without interruptions on the electrically-conducting layer. The converter layer preferably partially or completely covers the regions or sides of the semiconductor chips not covered by the carrier or the protective layer. In particular, in step E), in each case a radiation exit side of the semiconductor chips facing away from the carrier is covered by the converter layer.

Suitable materials for the converter particles of the converter layer are, e.g., garnets such as $(Y, Lu, Gd, Tb)_3(Al_{1-x}, Ga_x)_5O_{12}:Ce^{3+}$, or doped silicon nitrides such as $(Ca, Ba, Sr)_2Si_5N_8:EU^{2+}$, or doped silicon/aluminum nitrides such as $(Ca, Sr)AlSiN_3:Eu^{2+}$ or $Sr(Ca, Sr)Si_2Al_2N_6:Eu^{2+}$ or $(Sr, Ca)AlSiN_3*Si_2N_2O:Eu2+$ or $(Ca, Sr)Al_{1-4x/3)}Si_{(1+x)}N_3:Ce$ (x=0, 2–0, 5) or silicon oxide nitrides such as $(Ba, Sr, Ca)Si_2O_2N_2:Eu^{2+}$ or $AE_{2-X-a}RE_xEu_aSi_{1-y}O_{4-x-2y}N_x$ or $AE_{2-x-a}RE_xEu_aSi_{1-y}O_{4-x-2y}N_y$, or doped silicon oxides such as $(Ba, Sr, Ca)_2SiO_4:Eu^{2+}$ or $Ca_8Mg(SiO_4)_4Cl_2:Eu^{2+}$, wherein AE is an alkaline earth metal and RE is a rare earth metal.

The converter particles have grain sizes of at least 100 nm or 1 µm or 10 µm, for example. Alternatively, or in addition, the grain sizes are at least 50 µm or 20 µm or 1 µm.

Besides the converter layer, further layers, e.g., having materials for light scattering and/or having color pigments, can be deposited on to the electrically-conducting layer, in particular deposited electrophoretically. Just as well, materials for light scattering and/or color pigments can be deposited together with the converter particles in a common electrophoretic process.

The electrically-conductive layer may be removed from regions between the converter layer and the semiconductor chips in a step F). The removal can take place via a protic reactant and/or a solvent, for example. The electrically-conductive layer is structurally modified and/or dissolved below the converter layer. Dissolving or structurally modifying the electrically-conductive layer achieves that at least 90% or 95% or 99% of the electromagnetic radiation emerging from the semiconductor chip get into the converter layer. A radiation-absorbing effect of the electromagnetic layer previously possibly present is preferably reduced or eliminated by the removal.

Each optoelectronic component produced using this method includes exactly one semiconductor chip having the converter layer applied thereon and the electrically-conductive layer remaining at least on subregions of the side surfaces of the semiconductor chips. Semiconductor layers of the semiconductor chip are preferably insulated from the electrically-conductive layer by an insulating layer such that shorts are prevented during operation later on.

The method of producing optoelectronic components may comprise a step A), in which a carrier and a multitude of optoelectronic semiconductor chips are provided, with each semiconductor chip comprising contact elements arranged on a contact side of the semiconductor chip for external electrical contacting. In a step B), the semiconductor chips are attached on to the carrier laterally next to one another, with the contact sides made to face the carrier during attachment. In a step C), an electrically-conductive layer is applied at least on to sides of the semiconductor chips which are not covered by the carrier with the electrically-conductive layer being of contiguous design. In a step D), a protective layer is applied at least on to subregions of side surfaces of the semiconductor chips extending transversely to the contact surface. In a step E), a converter layer is electrophoretically deposited on to the electrically-conductive layer, with the converter layer being configured to convert at least part of a radiation emitted by the semiconductor chips into radiation of a different wavelength range during the intended operation. In a step F), the electrically-conductive layer is removed from regions between the converter layer and the semiconductor chips.

In particular, the idea described herein is to cover semiconductor chips with a converter element in the form of a thin converter layer by an electrophoretic process. Compared to components having thick converter elements, the thin converter layer improves the thermal properties of the finished components. In particular, this results in a heat-up of the semiconductor chips or the converter elements to be less intense, thereby allowing to reduce typical thermal effects such as discolorations and crack formations in the converter element or the shifting of the chromaticity coordinates or efficiency drops. In addition, a thin converter layer comes with the advantage that, compared to a thick converter potting, less radiation is emitted toward the rear side, e.g., in the direction of a connection carrier.

Furthermore, I make use of the fact that an electrically-conducting layer, e.g., a metal layer, is used for electrophoretic deposition. This electrically-conductive layer can, for example, be reflective to a radiation of the semiconductor chips emitted during operation. Due to the fact that the side surfaces of the semiconductor chips are covered with the protective layer in step D), it is prevented on the one hand that the converter layer is deposited on the side surfaces of the semiconductor chips and, on the other hand, the protective layer preferably protects the electrically-conductive layer from detaching in step E) such that the electrically-conductive layer still covers the side surfaces and preferably mirror-coats them after step E).

On the whole, the method provides a homogenous deposition of converter layers on to semiconductor chips and a mirror-coating of side surfaces of the semiconductor chips in only a few process steps.

Steps A) to F) may be performed in the specified order.

In step F), the protective layer may prevent the electrically-conductive layer from being removed in the regions covered by the protective layer. Preferably, the electrically-conductive layer is almost not structurally changed or dissolved below the protective layer in step E) so that in these regions, 90% or 95% or 100%, for example, of the originally formed electrically-conductive layer remain are maintained.

The regions of the electrically-conductive layer covered by the protective layer may remain free of the converter layer in step E).

In these regions, in particular, no direct contact of the converter layer and the electrically-conductive layer results. Preferably, the side surfaces of the semiconductor chips or at least the regions covered by the protective layer of the side surfaces of the semiconductor chips are not covered by the converter layer in the finished components.

The electrically-conductive layer may be reflective to a radiation generated during operation of the semiconductor chip. The electrically-conductive layer has a reflectivity to this radiation of at least 80% or 90% or 95%, for example. The reflectivity can be an average reflectivity which is averaged over the entire emission spectrum of the semiconductor chips, for example. It is also possible for the reflectivity to be indicated at the wavelength at which the emission spectrum of the semiconductor chip has a global intensity maximum.

In step C), the electrically-conductive layer may be applied on to all sides of the semiconductor chips not covered by the carrier. Preferably, the electrically-conductive layer covers all these sides during or after step C), in particular the side surfaces of the semiconductor chips by at least 90% or 95% or 99% or completely.

Free spaces located between two neighboring semiconductor chips may be filled with the protective layer in step D). In the free spaces, the carrier may be exposed prior to filling. The protective layer is a potting material with which the free spaces can completely be filled. The protective layer is arranged to surround the semiconductor chips such that at least one or all side surfaces of the semiconductor chips are in each case covered by the protective layer by at least 90% or 95% or 100%.

The protective layer or the potting material can be introduced and/or structured between the components, by one of the following methods, for example: photolithography, direct laser writing, laser ablation, forming technology such as punching, micro spray coating, screen printing, pad printing, jetting, dispersing, injection-molding, transfer molding, a spraying technique or by tape casting technology.

After singulation of the semiconductor chips, the protective layer can be detached from the semiconductor chips. Alternatively, the protective layer remains on the side surfaces of the semiconductor chips in the finished components as well.

In step D), in each case a radiation exit surface opposite the contact side of the semiconductor chips may remain partially or completely free of the protective layer. The radiation exit surface is in particular the side partially or completely covered by the converter layer in step E).

The carrier may have a connecting layer applied thereon. During application in step B), the contact elements are, e.g., pressed into the connecting layer deep enough that the contact elements are protected from the risk of being covered by the electrically-conductive layer and thus from the risk of short circuits. To that end, the contact elements are completely pressed into the connecting layer, for example. Therefore, the connecting layer is preferably deformable and/or elastic.

The connecting layer extends in particular continuously and contiguously along the carrier and has no interruptions between the semiconductor chips or in the region of the semiconductor chips. The connecting layer has a thickness of at least 2 µm or 5 µm or 10 µm, for example. Alternatively or in addition, the connecting layer has a thickness of at most 30 µm or 20 µm or 15 µm.

The connecting layer may comprise or consist of a thermoplastic material. Thermoplastics are in particular plastic materials that can be deformed within a specific temperature range. To attach the semiconductor chips on to the carrier, the connecting layer can therefore preferably be made to reach a certain temperature such that the contact elements can be pressed into the connecting layer. I found that connecting layers, e.g., of thermoplastic materials, also provide a particular good protection of the contact elements against in particular wet-chemical processes.

The semiconductor chips may be detached from the carrier after step F), e.g., by correspondingly heating the connecting layer or the carrier. The semiconductor chips having the converter layer can be singulated prior to or after detachment from the carrier, for example, along separation planes by the potting material in the form of the protective layer. In this way, individual optoelectronic components are produced. In the finished components, the contact elements of the semiconductor chips are preferably exposed and freely accessible.

The singulated components detached from the carrier are in particular formed to be mechanically self-supporting and stable, even without further potting materials, i.e., also without the protective layer. The dimensions of the optoelectronic components are preferably adapted to the dimensions of the semiconductor chips, i.e., deviate from the respective dimensions of the semiconductor chips in their lateral and/or vertical dimensions by less than 10% or 5% or 1%.

After step E), the converter layer may cover the radiation exit surfaces of the semiconductor chips by at least 90% or 95% or 99% or completely.

In step F), the electrically-conductive layer may be removed by a wet-chemical process.

The electrically-conductive layer may comprise or consist of at least one metal or a metal alloy. Possible metals are, for example: Al, Ag, Au, Ti, Pt, Li, Na, Ka, Ru, Cs, Be, Ca, Mg, Sr, Ba, Sc, Si, Ga, Sn. However, it is also possible that the electrically-conductive layer includes or consists of a transparent conductive material such as ITO or ZnO.

In step F), the metal of the electrically-conductive layer may be partially or completely converted into a salt from the metal by a chemical reaction. To that end, the electrically-conductive layer can be brought into contact with a protic reactant and subsequently washed out by a solvent, for example. Such a method is known from WO 2014/001149 A1, for example.

The mole fraction of the salt in the converter layer may be at least 0.001% or 0.01% or 0.1% after step F). Alternatively, or in addition, the mole fraction of the salt is 2% at most or 1% at most or 0.5% at most. The salt can actually be distributed within the converter layer and/or form a separate layer below the converter layer. In the latter case, the separate layer is considered to be a part of the converter layer, for example.

The converter layer may have a homogenous layer thickness after the deposition process in step E), with maximum thickness deviations of 20% or 10% or 5% or 3% or 1% with respect to an average value of the layer thickness. The average value of the layer thickness is determined along the entire extent of the converter layer. By such a homogenous layer thickness, a particularly high color locus homogeneity can be realized along the entire radiation exit surface of the semiconductor chips.

The layer thickness of the converter layer after step F) may be 70 µm or 50 µm or 30 µm, at the most. Alternatively, or in addition, after step F), the layer thickness is at least 10 µm or 20 µm or 30 µm. In this case, the layer thickness relates to the maximum or average layer thickness of the converter layer.

After step F), the converter layer may extend on each individual semiconductor chip, in particular on the radiation exit surface, continuously, contiguously and without interruptions.

The converter layer may be formed of a powder of converter particles. The converter layer is thus free of a binding agent such as a silicone or a resin connecting the individual converter particles with one another. The mole fraction of the converter particles in the converter layer is preferably at least 90% or 95% or 99%. The converter layer, as an individual part, is, e.g., porous and/or brittle and/or fragile and/or mechanically unstable. In particular, the converter layer is non-ceramic and/or un-sintered. The converter layer can be held, e.g., on the semiconductor chip at least temporarily dimensionally-stable by Van-der-Waals forces.

After step E), the converter layer may be enclosed by an encapsulation layer, e.g., in a form-fit manner. The encapsulation layer can be in direct contact with the converter layer and preferably prevents a later chipping or detaching of the converter layer from the semiconductor chips. This is advantageous particularly due to the fact that the converter layer preferably consists of a powder of converter particles. The encapsulation layer comprises or consists of a silicone or parylene or a resin, for example. The layer thickness of the encapsulation layer on the converter layer is preferably at least 100 nm or 500 nm or 1µm, for example. As an alternative or in addition, the layer thickness of the encapsulation layer is at most 500 µm or 300 µm or 100 µm or 10 µm. The encapsulation layer can in particular be a potting material, e.g., a silicone potting material applied on to the semiconductor chips with the converter layer.

However, it is also possible to arrange a thin fixation layer between the encapsulation layer and the converter layer to fix the converter particles or the converter layer on the semiconductor chips. The fixation layer is based on a polymer, for example, and has a thickness of 100 nm to 1 µm.

The encapsulation layer may comprise or consist of a transparent material. The transparent material is in particular transmissive at a level of at least 80% or 90% or 95% for the radiation emitted by the semiconductor chips and/or the converter element.

The carrier may be a circuit board on which the semiconductor chips electrically connect or mechanically-permanently attach to one another in step B. When using such a circuit board as a carrier, the carrier preferably remains on the semiconductor chips, i.e., is not detached from the semiconductor chips after step F). The circuit board can be an active matrix element, for example, by which the individual semiconductor chips can be controlled individually and independently from one another.

Each carrier may have a protective frame attached thereon for each semiconductor chip, for example, made of a plastic material resistant against wet-chemical processes. During the attachment in step B), the semiconductor chips are preferably placed on the carrier such that the contact elements are partially or completely enclosed by the respective protective frame. In particular, the protective frame is to prevent the contact elements from being covered by the electrically-conductive layer in step C).

The semiconductor chips may be so-called volume emitters having a growth substrate and a semiconductor layer sequence grown on the growth substrate. The growth substrate also forms the stabilizing component in the semiconductor chip; further stabilizing measures are not required then. The growth substrate may comprise or consist of sapphire or silicon or germanium or SiC or GaN. The semiconductor layer sequence is, e.g., based on a III-V compound semiconductor material, in particular on AlInGaN or AlGaAs. Furthermore, the semiconductor layer sequence preferably comprises an active layer comprising at least one p-n junction and/or a quantum well structure.

The contact elements may be arranged on a side of the semiconductor layer sequence facing away from the growth substrate. Therefore, the semiconductor chips can be so-called flip chips, in particular sapphire flip chips.

The semiconductor chips may in each case be thin-film semiconductor chips having a substrate stabilizing the semiconductor chip and a semiconductor layer sequence attached on to the substrate. The substrate differs from the growth substrate of the semiconductor layer sequence and the growth substrate is removed. In this case, the substrate per se forms the stabilizing component of the semiconductor chip, without remainders of a growth substrate contributing or having to contribute to stabilization. In this case, the contact elements are preferably attached on to a side of the substrate facing away from the semiconductor layer sequence.

Furthermore, a surface-mounted optoelectronic component is provided. The optoelectronic component can in particular be produced by the method described herein. In other words, all features disclosed in conjunction with the component are also disclosed for the method and vice versa.

The surface-mounted optoelectronic component may comprise an optoelectronic semiconductor chip with exposed contact elements for external electrical contacting of the component. The contact elements are arranged at a common contact side of the semiconductor chip.

A converter layer of contiguous, continuous configuration and without interruptions may be applied, in particular directly applied, on to a radiation exit surface opposite the contact side, with the converter layer covering the radiation exit surface by at least 90%.

An encapsulation layer may be applied on to the converter layer and covers and completely encloses this converter layer. In particular, the encapsulation layer encloses the converter layer in a form-fit manner and/or is in direct contact with the converter layer.

An electrically-conductive layer may be attached, in particular directly attached, on to side surfaces extending transversely to the contact side of the semiconductor chip. Preferably, the electrically-conductive layer covers all side surfaces in each case by at least 90%.

The converter layer may be configured to convert at least part of a radiation emitted by the semiconductor chip into radiation of a different wavelength range during the intended operation.

The converter layer may have a homogenous layer thickness along its entire lateral extent on the semiconductor layer chip with maximum thickness deviations of 5% from an average value of the layer thickness.

The layer thickness of the converter layer may be 70 μm at the most.

The converter layer may be a powder of converter particles, the powder being held on the semiconductor chip by the encapsulation layer.

The electrically-conductive layer may have a layer thickness 100 nm to 500 nm. Reflectivity of the electrically-conductive layer to a radiation emitted by the semiconductor chip is at least 80%, for example.

The converter layer may comprise a salt of a metal, the mole fraction of which in the converter layer is 0.001% to 2%.

A protective layer may be applied on to the reflective, metal layer and therefore on to the side surfaces of the semiconductor chips, this layer extending without interruptions around the semiconductor chip. The protective layer comprises or consists of a white plastic material, for example.

In the following, a method described herein to produce optoelectronic components as well as an optoelectronic surface-mounted component is explained in greater detail by the drawings using examples. The same reference numerals indicate the same elements throughout the individual figures. However, no references are made to scale; individual elements may rather be illustrated in an exaggeratedly large manner for the purpose of a better understanding.

Figure 1A:
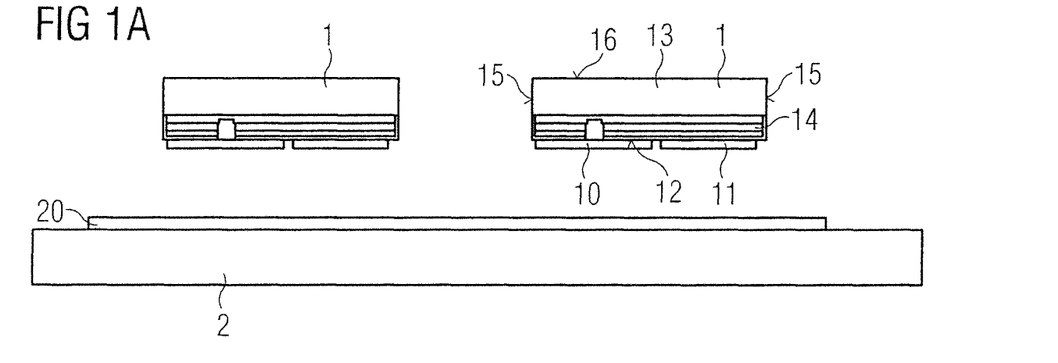
FIGS. 1A-1I and 2 show cross-sectional views of various method steps of producing examples of optoelectronic components.

FIG. 1A shows a first method step of producing examples of optoelectronic components 100. A carrier 2, e.g., a glass carrier, and semiconductor chips 1 are provided. The semiconductor chips 1 include a substrate 13 and a semiconductor layer sequence 14 applied thereon. The substrate 13 is, e.g., a growth substrate for the semiconductor layer sequence 14. The substrate 13 is, e.g., a sapphire substrate having a AlInGaN semiconductor layer sequence 14 grown on it. A side of the semiconductor layer sequence 14 facing away from the growth substrate 13 is formed as a contact side 12 on which contact elements 10, 11 for external electrical contacting the semiconductor layer sequence 14 or the semiconductor chip 1 are attached.

A side of the semiconductor chip 1 facing away from the contact side 12 is in each case formed as a radiation exit surface 16 via which a large proportion, for example, at least 90% of the radiation generated by the semiconductor chip 1, is emitted. The contact side 12 and the radiation side 16 connect to one another via side surfaces 15 running transversely to the contact side 12.

In the method step of FIG. 1A, the semiconductor chips 1 are attached on to the carrier 2, with the contact sides 12 facing the carrier 2. Furthermore, a connecting layer 20 formed contiguously and continuously is applied on to the carrier 2 consisting of a thermoplastic material, for example.

Figure 1B:
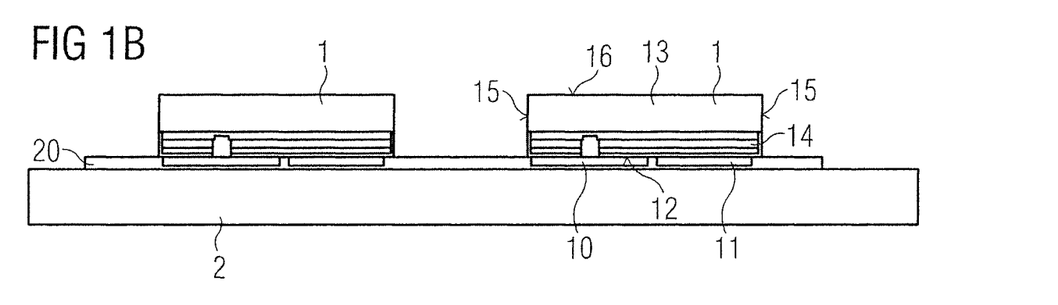

In the method step shown in FIG. 1B, the semiconductor chips 1 are arranged on the carrier 2 laterally next to one another, with the contact elements 10, 11 pressed, in particular completely pressed and embedded into the connecting layer 20. In this way, the contact elements 10, 11 are protected by the connecting layer 20 from impact of the further method steps. For example, the semiconductor chips 1 were pressed as deep that the growth substrate 13 contacts the connecting layer 20. To that end, the connecting layer 20 and/or the carrier 2 and/or the semiconductor chips 1 are heated to a certain temperature, at which the semiconductor chips 1 can be pressed into the connecting layer 20. In this case, the carrier 2 was heated to approximately 80° C. and the semiconductor chips 1 were heated to approximately 200° C.

It can also be taken from FIG. 1B that the semiconductor chips 1 are laterally spaced from one another, i.e., that interspaces are formed between the semiconductor chips 1, in which the carrier 2 or the connecting layer 20 are exposed.

Figure 1C:
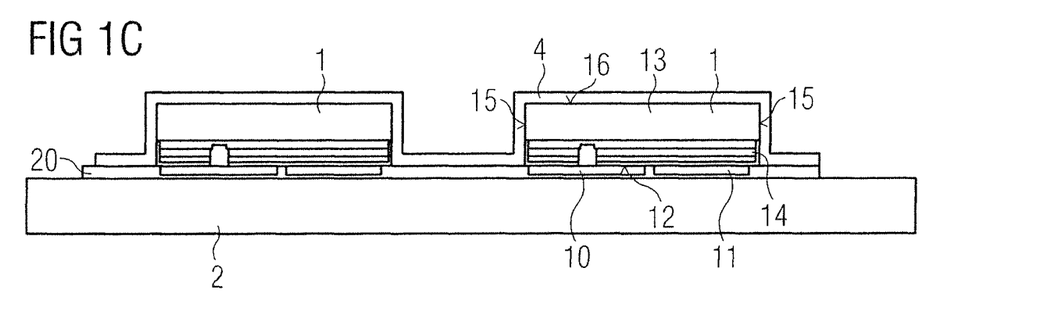

The method step of FIG. 1C shows how an electrically-conductive layer 4 made of a metal such as Al or Ag, for example, is applied on to the semiconductor chips 1 and the carrier 2 in a form-fit manner. The electrically-conductive layer 4 is applied as a layer formed contiguously, continuously and without interruptions, covering all sides of the semiconductor chips 1 not covered by the carrier 2. The regions of the carrier 2 between the semiconductor chips 1 are covered by the electrically-conductive layer 4.

Application of the electrically-conductive layer 4 can be effected via a sputtering process or vapor deposition or atomic layer deposition. In this case, the electrically-conductive layer 4 has, e.g., a layer thickness of 20 nm to 2 µm inclusive. In particular, the electrically-conductive layer 4 has a reflectivity of at least 80% to a radiation emitted by the semiconductor chips 1.

Figure 1D:
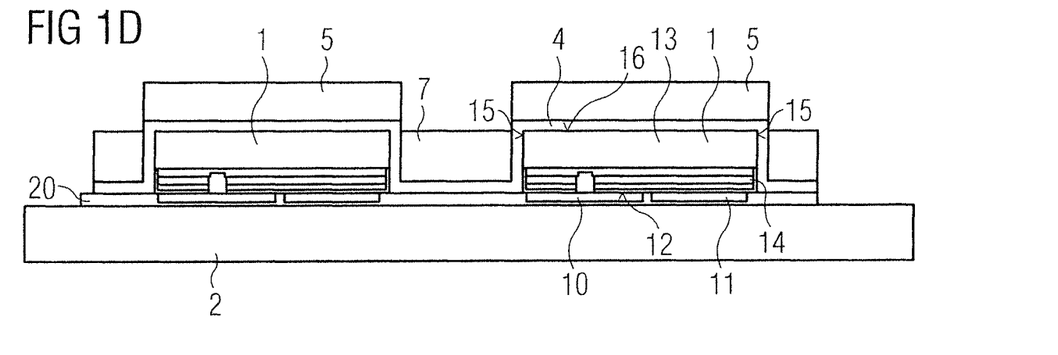

FIG. 1D shows a method step in which a protective layer 7 in the form of a potting material is introduced between the semiconductor chips 1. Introducing the protective layer 7 can be effected via jetting or transfer molding or injection molding, for example. The protective layer 7 is a white plastic material, for example. The protective layer 7 is filled in between the semiconductor chips 1 to such an extent that the side surfaces 15 and the electrically-conductive layer 4 applied thereon are completely covered by the protective layer 7. The protective layer 7 laterally inmolds the semiconductor chips 1 and completely encloses them.

FIG. 1D further shows how a converter layer is applied on to the semiconductor chips 1. The converter layer 5 is preferably applied after the protective layer 7 has been applied. Application of the converter layer 5 is effected via an electrophoretic process as described in WO 2014/001149 A1, for example. In this case, the converter layer 5 is only deposited in regions of the electrically-conductive layer 4 that are uncovered by the protective layer 7, i.e., in this case only at the radiation exit sides 16 of the semiconductor chips 1. The converter layer 5 extends in each case continuously, contiguously and without interruptions on the radiation exit surfaces 16.

Preferably, the converter layer 5 is formed of a powder of converter particles, i.e., free of a connecting agent. Furthermore, a layer thickness of the converter layer 5 is preferably 70 µm at most. The regions between the semiconductor chips 1 filled with the protective layer 7 are not covered by the converter layer 5.

Figure 1E:
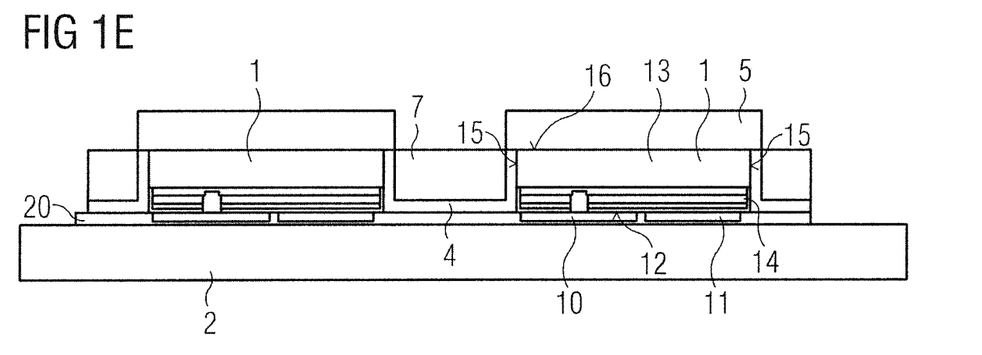

FIG. 1E shows a further method step in which the electrically-conductive layer 4 arranged between the semiconductor chips 1 and the converter layer 5 has been removed. Removal can be effected by a wet-chemical process, for example, in which the metal of the electrically-conductive layer 4 is converted into a salt. Furthermore, the salt can at least in part be removed from the converter layer 5 by a solvent.

In FIG. 1E, removal of the electrically-conductive layer is mostly or exclusively effected in the region of the radiation exit surface 16. The side surfaces 15 of the semiconductor chips 1 remain covered, in particular completely covered by the electrically-conductive layer 4. During the method step, the protective layer 7 protects the electrically-conductive layer 4 against the wet-chemical process.

Figure 1F:
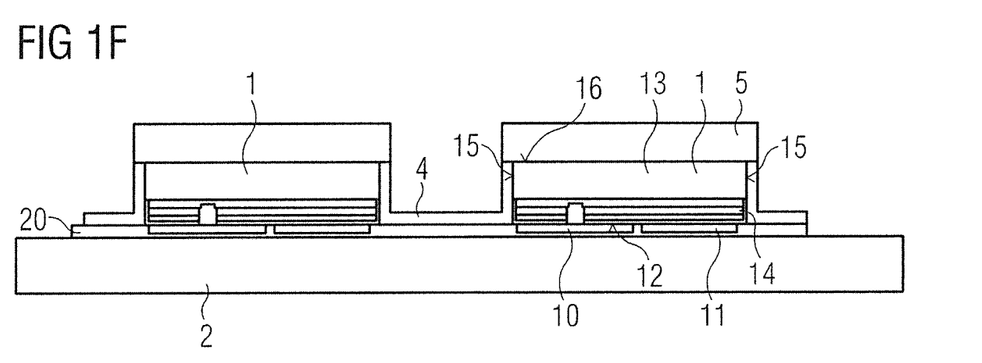

FIG. 1F shows an additional intermediate step in which the protective layer 7 is removed, in particular completely removed, from the side surfaces 15. This, in turn, can be effected by a solvent. The step of removing the protective layer 7 is optional.

Figure 1G:
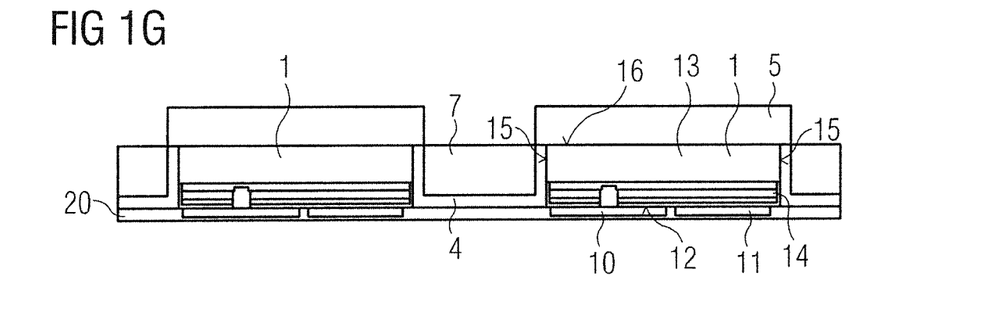

In the method step of FIG. 1G, the carrier 2 is detached from the semiconductor chips 1, but the semiconductor chips 1 still connect to one another by the potting material having the form of a protective layer 7.

Figure 1H:
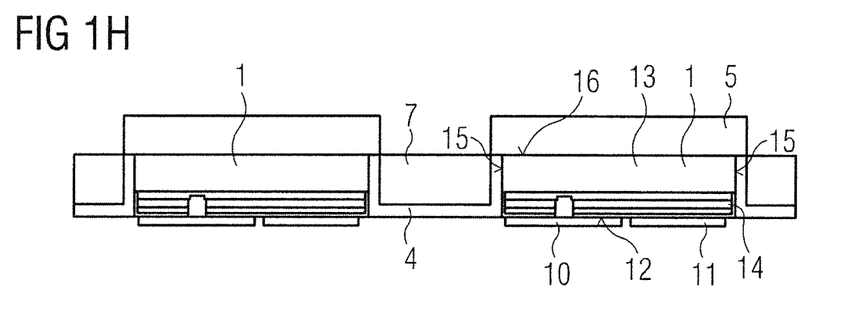

In the method step of FIG. 1H, the connecting layer 20 is detached from the contact sides 12, respectively from the contact elements 10, 11 of the semiconductor chips 1 as well. Detaching the carrier 2 and/or the connecting layer 20 can be effected by heating the semiconductor chips 1, the carrier 2 or the connecting layer 20.

Figure 1I:
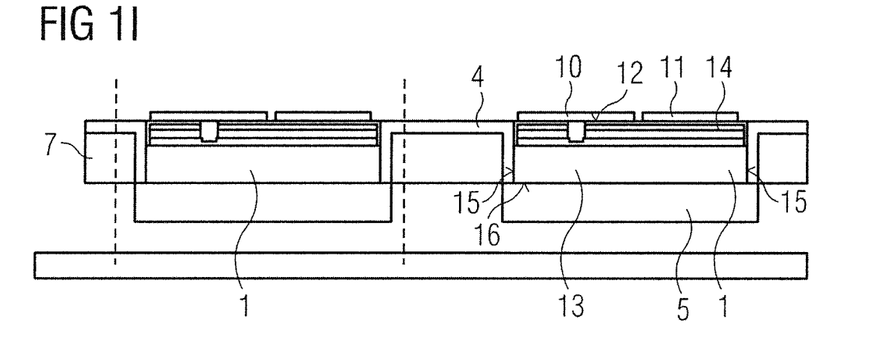

In the example of FIG. 1I, the semiconductor chips 1 still connected to one another are attached on to an intermediate carrier, with the converter layers 5 of the semiconductor chips 1 made to face the intermediate carrier. On the intermediate carrier, the semiconductor chips 1 are singulated along separating trenches (here illustrated by dashed lines) through the protective layer 7 and the electrically-conductive layer 4. In this way, individual, surface-mounted optoelectronic components are obtained, each comprising a semiconductor chip 1, a converter layer 5 and mirror-coated side surfaces 15.

Figure 2:
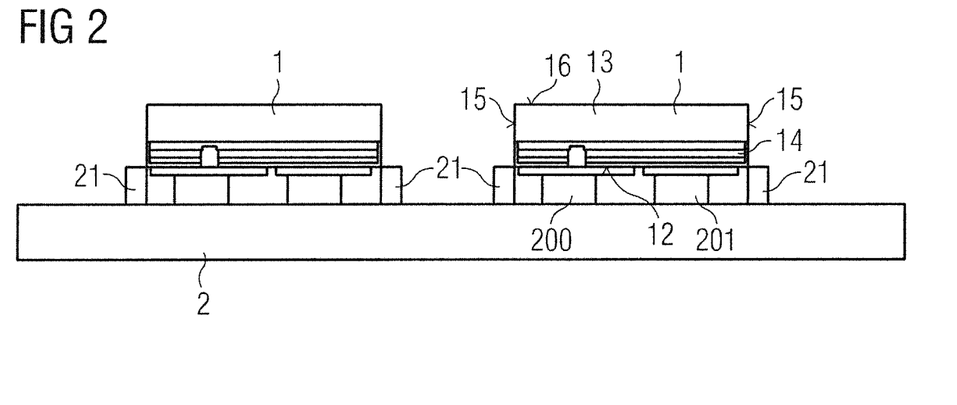

FIG. 2 shows an alternative method step essentially corresponding to the method step of FIG. 1B. In contrast to FIG. 1B, the carrier 2 has no connecting layer 20 applied thereon, but in FIG. 2, the carrier 2 comprises a protective frame 21 for each semiconductor chip 1, this frame based on a plastic material, for example. The protective frame 21 performs the same task as the connecting layer 20 and is to protect the contact elements 10, 11 during the further method steps.

Furthermore, in FIG. 2, the carrier 2 is formed as a circuit board having connecting areas 200, 201 formed thereon. The connecting areas 200, 201 connect to the contact element 10, 11 in an electrically-conducting manner such that the semiconductor chips 1 electrically-connect via the carrier 2. The carrier 2 is, e.g., an active matrix element, via which each of the semiconductor chips 1 can be controlled individually and independently from one another.

Figure 3A:
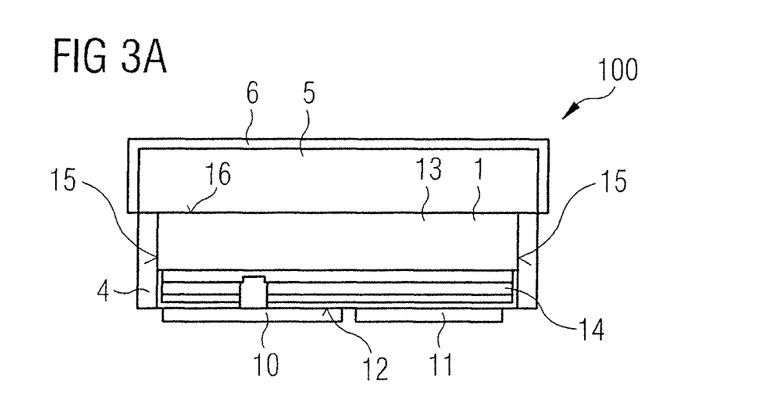
FIGS. 3A-3C show examples of a surface-mounted optoelectronic component in a cross-sectional view.

FIG. 3A shows an example of a surface-mounted optoelectronic component 100. The optoelectronic component 100 substantially corresponds to one of the components 100 produced by method steps 1A to 1I. In FIG. 3, however, the component 100 has the protective layer 7 detached from the side surfaces 15 such that the electrically-conductive layer 4 is exposed towards the outside. It is also possible for a thin passivation layer to be applied on to the electrically-conductive layer 4, protecting the electrically-conductive layer 4 from external impacts.

In FIG. 3A, the converter layer 5 laterally protrudes from the semiconductor chip 1, i.e., in parallel to the radiation exit surface 16. The converter layer 5 terminates laterally flush with the electrically-conductive layer 4.

Furthermore, it can be taken from FIG. 3A that the converter layer 5 is coated with an encapsulation layer 6 completely enclosing the converter layer 5. The encapsulation layer is intended to prevent the converter layer 5, which is largely configured as a powder, from crumbling off or flaking off. The encapsulation layer 6 is formed of a transparent, in particular clear-sighted material such as $SiO_2$ or silicone.

Figure 3B:
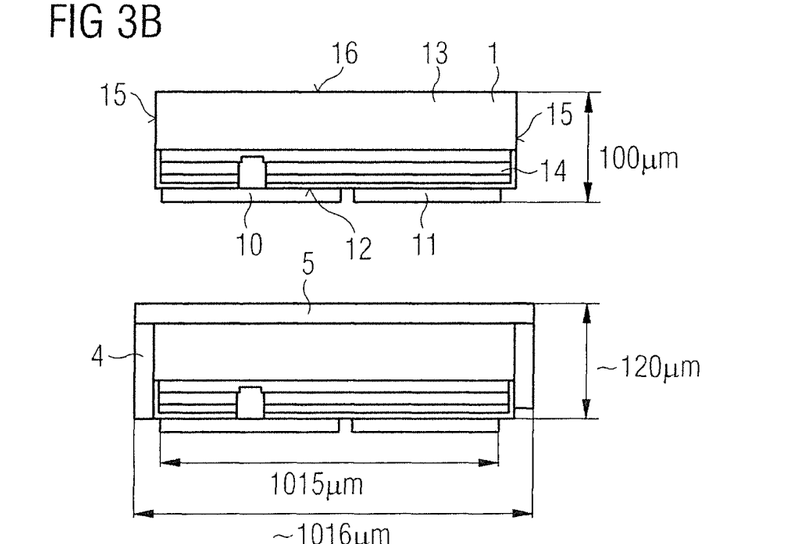

FIG. 3B shows the dimensions of the component of FIG. 3A. The upper part of the picture shows the original semiconductor chip 1, before an electrically-conductive layer 4 or a converter layer 5 is applied on it. The lateral dimension of the semiconductor chip 1 parallel to the contact side 12 is approximately 1015 µm. The vertical dimension perpendicular to the contact side 12 is approximately 100 µm.

The lower part of FIG. 3B shows the optoelectronic component 100 of FIG. 3A and compares it to the dimensions of the semiconductor chip 1. It can be seen that the lateral dimensions of the component 100 deviate from the lateral dimensions of the semiconductor chip 1 by less than 1%. On the side surfaces 15 of the semiconductor chip 1, the electrically-conductive layer 4 in particular has a layer thickness of less than 500 nm. The converter layer 5 applied on to the radiation exit side 16 has a thickness of approximately 20 μm.

Figure 3C:
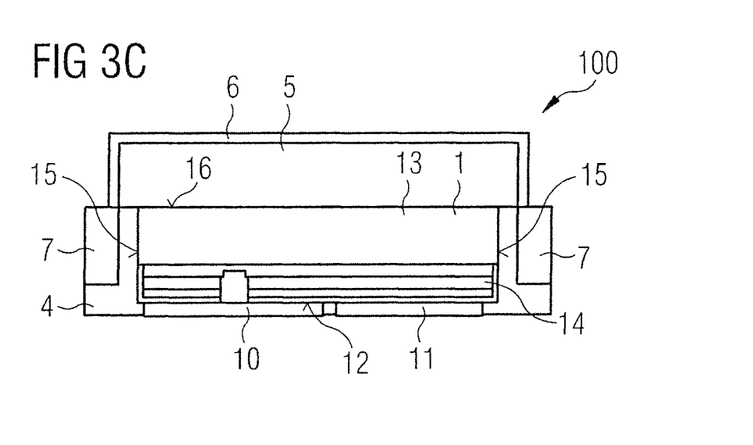

In contrast to FIG. 3A, in the example of FIG. 3C, the electrically-conductive layer 4 still has the protective layer 7 applied thereon on to the side surfaces 15 or on the electrically-conductive layer 4. The protective layer 7 extends completely laterally-surrounding the semiconductor chip 1 and covers the side surfaces 15, for example, by at least 90%. The layer thickness of the protective layer 7 on the semiconductor chip 100 is 50 μm to 100 μm, for example. The protective layer 7 may have an additional reflective effect on radiation emitted from the semiconductor chip 1 and apart from the electrically-conductive layer 4 also mirror-coats the side surfaces 15 of the semiconductor chip 1.

Figure 4A:
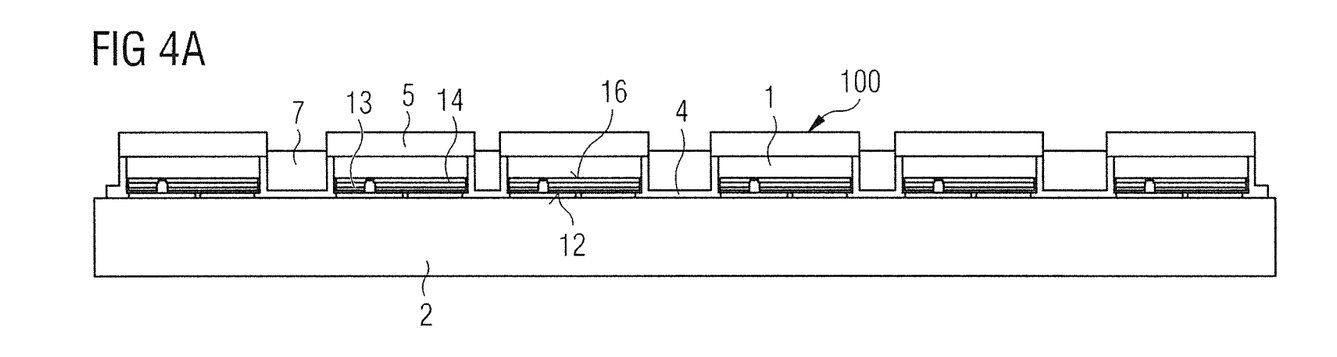
FIGS. 4A and 4B in each case show an illuminant in a cross-sectional view with a multitude of optoelectronic components.

FIG. 4A illustrates an illuminant having a multitude of optoelectronic components 100 described herein applied on to a carrier 2. In contrast to FIGS. 1A to 1I, the carrier 2 is not a temporary carrier, removed again from the semiconductor chips 1, but the carrier 2 rather permanently remains on the optoelectronic components 100. The illuminant of FIG. 4A can be produced using method steps of FIGS. 1A to 1I, merely the detachment of the carrier 2 is omitted.

The carrier 2 may, e.g., be an active matrix material or a printed circuit board, PCB for short, or a metal core plate. The individual components 100 can, e.g., electrically connect above the carrier 2. A display can be realized by the illuminant of FIG. 4A, in which each component forms a pixel. The individual pixels of the illuminant can optically and clearly be separated from one another by making use of the mirror coating of the side surfaces 15 of the semiconductor chip 1.

Figure 4B:
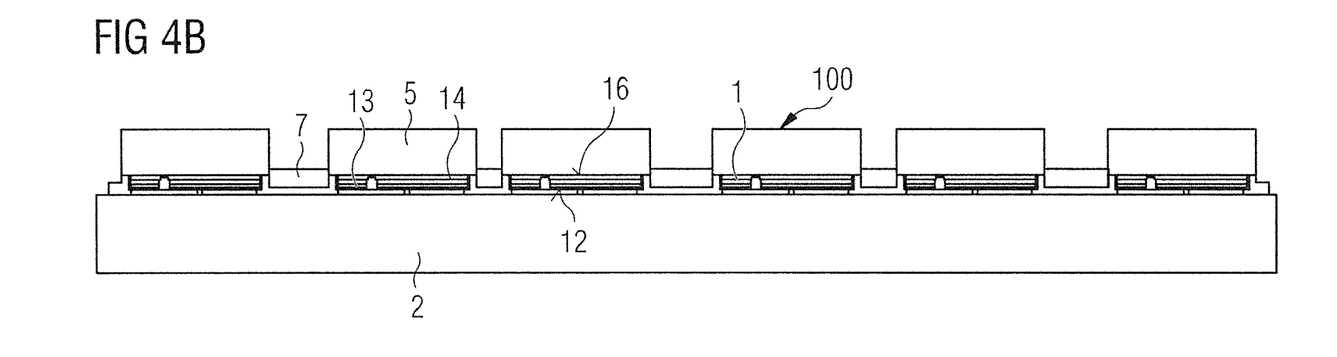

Just like FIG. 4A, FIG. 4B shows an illuminant having a multitude of optoelectronic components 100 attached thereon on a carrier 2. In contrast to FIG. 4A, the semiconductor chips 1 are not volume emitters having a sapphire growth substrate 13 and a semiconductor layer sequence 14 grown thereon. Rather, in FIG. 4B, each individual semiconductor chip 1 has the growth substrate detached therefrom and, instead, the semiconductor layer sequence 14 is applied on to a new substrate 13. Instead of forming the growth substrate, the substrate 13 forms the stabilizing mechanical component of the semiconductor chips 1. The substrate 13 is formed of metal or a semiconductor material, for example. The semiconductor chips 1 of FIG. 4B are generally referred to as thin-film semiconductor chips.

Figure 5:
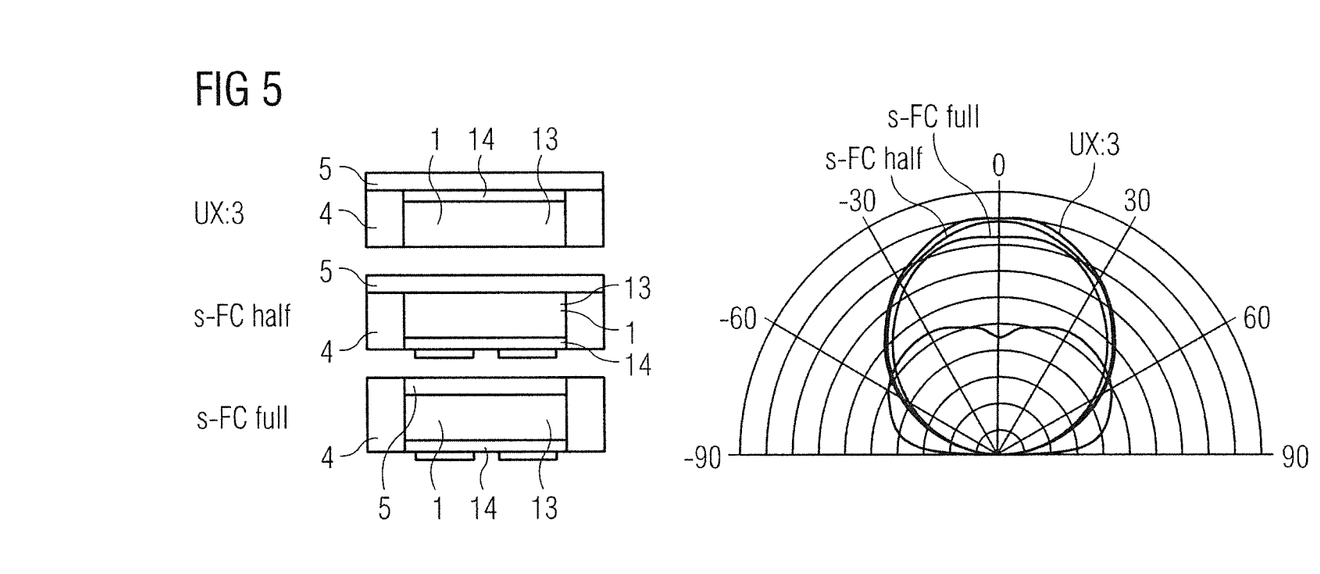
FIG. 5 shows radiation characteristics of various optoelectronic components.

FIG. 5 shows a comparison of the radiation characteristics of a multitude of optoelectronic components. The upper left part of FIG. 5 illustrates a so-called UX:3 chip, which basically corresponds to a thin film semiconductor chip. The thin film semiconductor chip has a converter layer 5 applied thereon. The right part of the image shows the radiation characteristic of the UX3-chip, in which can be discerned that this almost follows a Lambert distribution.

In the center on the left side of FIG. 5, an optoelectronic component, as shown in FIG. 3A, is shown. The radiation characteristics of the s-FC-half component is very similar to that of the UX:3-chip.

The lower part on the left side in FIG. 5 shows a similar component as in FIG. 3A, which element, however, also has side surfaces of the converter layer 5 covered by the electrically-conductive layer 4 (s-FC-full). In view of radiation characteristics, the difference to the s-FC half component is only small.

My methods and components are not limited by the description with the aid of the examples. This disclosure rather comprises any new feature as well as any combination of features, which in particular includes any combination of features in the appended claims, even if the feature or combination of features is per se not explicitly specified in the claims or in the examples.

This application claims priority of DE 10 2015 107 588.1, the subject matter of which is incorporated herein by reference.

The invention claimed is:

1. A method of producing optoelectronic components comprising:
   A) providing a carrier and a multitude of separated, unconnected optoelectronic semiconductor chips, wherein each semiconductor chip comprises contact elements for external electrical contacting arranged on a contact side of the semiconductor chip;
   B) applying the semiconductor chips laterally next to one another on to the carrier, wherein the contact sides are made to face the carrier during application;
   C) applying an electrically-conductive layer at least on to subregions of the sides of the semiconductor chips not covered by the carrier, wherein the electrically-conductive layer is of contiguous design;
   D) applying a protective layer at least on to subregions of side surfaces of the semiconductor chips running transversely to the contact surface;
   E) electrophoretically depositing a converter layer on to the electrically-conductive layer, wherein the converter layer is configured to convert at least part of radiation emitted by the semiconductor chips into radiation of a different wavelength range during the intended operation; and
   F) removing the electrically-conductive layer from regions between the converter layer and the semiconductor chips, wherein
   a connecting layer is applied on to the carrier and, during application in step B), the contact elements are pressed into the connecting layer deep enough that the contact elements are protected from being covered by the electrically-conductive layer in step C), or
   a protective frame is applied on to the carrier for each semiconductor chip and, during application in step B), the semiconductor chips are placed on the carrier such that the contact elements are at least partially enclosed by the corresponding protective frame, and in step C), the protective frame prevents the contact elements from being covered by the electrically-conductive layer.

2. The method according to claim 1, wherein
   in step F), the protective layer prevents the electrically-conductive layer from being removed in regions covered by the protective layer,
   in step E), the regions of the electrically-conductive layer covered by the protective layer remain free of the converter layer, and
   the electrically-conductive layer is reflective for light emitted by the semiconductor chips during operation.

3. The method according to claim 2, wherein
   in step C), the electrically-conductive layer is applied on to all sides of the semiconductor chips not covered by the carrier and thereby in each case covers the side surfaces by at least 90%, and in step D), free spaces located between two neighboring semiconductor chips are filled with the protective layer, wherein the protective layer is arranged laterally around the semiconductor chips such that all side surfaces of the semiconductor chips are in each case covered by the protective layer by at least 90%.

4. The method according to at least claim 1, wherein, in step D), in each case one radiation exit surface opposite the contact side of the semiconductor chips remains at least partially free of the protective layer.

5. The method according to claim 1, wherein
the connecting layer comprises or consists of a thermoplastic material, and
after step F), the semiconductor chips are detached from the carrier and singulated.

6. The method according to claim 1, wherein
in step F), the electrically-conductive layer is removed by a wet-chemical process,
the electrically-conductive layer comprises at least one metal or is formed of at least one metal,
in step F), the metal is partially or completely converted into a salt of the metal by a chemical reaction,
after step F), the mole fraction of the salt in the converter layer is 0.001% to 2%.

7. The method according to claim 1, wherein
the converter layer has a homogenous layer thickness with maximum thickness deviations of 5% from an average value of the layer thickness along its entire extent on the semiconductor chips,
after step F), the layer thickness of the converter layer is 70 μm at most, and
after step F), the converter layer extends contiguously, continuously and without interruptions on the semiconductor chips.

8. The method according to claim 1, wherein
the converter layer consists of a powder of converter particles, and
after step F), the converter layer is enclosed by an encapsulation layer that prevents the converter layer from chipping off or detaching from the semiconductor chip.

9. The method according to claim 1,
wherein the protective layer comprises or consists of a white plastic material,
the electrically-conductive layer has a layer thickness of 100 nm to 500 nm, and
a layer thickness of the protective layer on the side surfaces is 10 μm to 100 μm.

10. The method according to claim 1, wherein the carrier is a circuit board on which the semiconductor chips electrically connect and are mechanically attached in step B).

11. The method according to claim 1, wherein
the semiconductor chips are sapphire flip-chips with in each case a sapphire growth substrate stabilizing the semiconductor chip and a semiconductor layer sequence grown on the sapphire growth substrate, and
the contact elements are arranged on a side of the semiconductor layer sequence facing away from the sapphire growth substrate.

12. A surface-mountable optoelectronic component comprising:
an optoelectronic semiconductor chip with exposed contact elements for external electrical contacting of the component, wherein the contact elements are arranged on a joint contact side of the semiconductor chip,
a converter layer formed contiguously, continuously and without interruptions and covering a radiation exit surface opposite the contact side by at least 90%,
an encapsulation layer applied on to the converter layer which completely covers and encloses the converter layer, and
an electrically-conductive layer on side surfaces of the semiconductor chip extending transversely to the contact side, wherein
the converter layer is configured to convert at least part of a radiation emitted by the semiconductor chip into radiation of a different wavelength range during the intended operation of the component,
the converter layer has a homogenous layer thickness along its entire extent on the semiconductor chip with maximum thickness deviations of 5% from an average value of the layer thickness,
the layer thickness of the converter layer is at most 70 μm,
the converter layer is a powder of converter particles, which is held on to the semiconductor chip by the encapsulation layer,
the electrically-conductive layer has a layer thickness of 100 nm to 500 nm, covers all side surfaces of the semiconductor chip in each case by at least 90% and has a reflectivity of at least 80% to the radiation emitted by the semiconductor chip, and
the radiation exit surface is at least partially free of the reflective, electrically-conductive layer.

13. The optoelectronic component according to claim 12, wherein the converter layer comprises a salt of a metal, the mole fraction of which in the converter layer is 0.001% to 2%.

14. The optoelectronic component according to claim 12, wherein
a protective layer is applied on to the electrically-conductive layer and extends around the semiconductor chip without interruptions, and
the protective layer comprises or consists of a white plastic material.

15. A method of producing optoelectronic components comprising:
A) providing a carrier and a multitude of optoelectronic semiconductor chips, wherein each semiconductor chip comprises contact elements for external electrical contacting arranged on a contact side of the semiconductor chip;
B) applying the semiconductor chips laterally next to one another on to the carrier, wherein the contact sides are made to face the carrier during application;
C) applying an electrically-conductive layer at least on to subregions of the sides of the semiconductor chips not covered by the carrier, wherein the electrically-conductive layer is of contiguous design;
D) applying a protective layer at least on to subregions of side surfaces of the semiconductor chips running transversely to the contact surface;
E) electrophoretically depositing a converter layer on to the electrically-conductive layer, wherein the converter layer is configured to convert at least part of a radiation emitted by the semiconductor chips into radiation of a different wavelength range during the intended operation; and
F) removing the electrically-conductive layer from regions between the converter layer and the semiconductor chips, wherein
during removal of the electrically-conductive layer in step F), the protective layer covers regions of the electrically-conductive layer and prevents the electrically-conductive layer from being removed in the regions covered by the protective layer, in step E), the regions of the electrically-conductive layer covered by the protective layer remain free of the converter layer, and the electrically-conductive layer is reflective for light emitted by the semiconductor chips during operation.

* * * * *